US008416393B2

(12) United States Patent
Wang et al.

(10) Patent No.: US 8,416,393 B2
(45) Date of Patent: Apr. 9, 2013

(54) CROSS QUADRUPOLE DOUBLE LITHOGRAPHY METHOD AND APPARATUS FOR SEMICONDUCTOR DEVICE FABRICATION USING TWO APERTURES

(75) Inventors: Hsien-Cheng Wang, Hsinchu (TW); Hung Chang Hsieh, Hsin-Chu (TW); Shih-Che Wang, Hsin-Chu (TW); Ping Chieh Wu, Shulin (TW); Wen-Chun Huang, Xi-Gang Xiang (TW); Ming-Chang Wen, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 808 days.

(21) Appl. No.: 12/417,090

(22) Filed: Apr. 2, 2009

(65) Prior Publication Data
US 2010/0255679 A1 Oct. 7, 2010

(51) Int. Cl.
G03B 27/72 (2006.01)
(52) U.S. Cl.
USPC .......................................................... 355/71
(58) Field of Classification Search .................... 355/71, 355/67, 77, 53
See application file for complete search history.

(56) References Cited

U.S. PATENT DOCUMENTS

| | | | |
|---|---|---|---|
| 2005/0221233 A1* | 10/2005 | Minvielle et al. | 430/313 |
| 2006/0277521 A1 | 12/2006 | Chen et al. | |
| 2010/0225893 A1* | 9/2010 | Krasnoperova | 355/71 |
| 2011/0212403 A1 | 9/2011 | Kuo et al. | |

OTHER PUBLICATIONS

Summers, Derek J., Quadrupole Illumination Design for a 193nm Hyper-NA Exitech Immersion Stepper, 22nd Annual Microelectronic Engineering Conference, May 2004, pp. 44, 46-51.

* cited by examiner

Primary Examiner — Toan Ton
Assistant Examiner — Chia-how Michael Liu
(74) Attorney, Agent, or Firm — Haynes and Boone, LLP

(57) ABSTRACT

Provided is a lithography system operation to include a first aperture or a second aperture. Each of the first and second apertures has two pairs of radiation-transmitting regions where one pair of radiation-transmitting regions are larger than a second pair. For an aperture, each pair of radiation-transmitting regions are on different diametrical axis. In an embodiment, one aperture is used for x-dipole illumination and the second aperture is used for y-dipole illumination.

19 Claims, 5 Drawing Sheets

CROSS QUADRUPOLE DOUBLE LITHOGRAPHY METHOD AND APPARATUS FOR SEMICONDUCTOR DEVICE FABRICATION USING TWO APERTURES

BACKGROUND

Semiconductor integrated circuit (IC) technology has experienced rapid progress including the continued minimization of feature sizes and the maximization of packing density. The minimization of feature size relies on improvement in photolithography and its ability to print smaller features or critical dimensions (CD). Various techniques have been developed to enhance the resolution of optical lithography. An example of such a technique is off-axis illumination (OAI). OAI illumination may include any radiation that reduces and/or eliminates the "on-axis" (on the optical axis) component of the radiation. For OAI however, the shape and size of the illumination must be optimized for the specific pattern that is to be printed on a substrate. Another RET technique used is double dipole lithography (DDL) or double patterning which can use a strong OAI. DDL requires decomposition of patterns into a vertical pattern and a horizontal pattern, which in turn requires two (double) exposure processes. However, the process window to perform DDL may be limited. Therefore, improvement of one or more of these disadvantages is needed.

SUMMARY

In an embodiment, a lithography system is provided. A first aperture is operable to be incorporated in the lithography system. The first aperture has a first pair of radiation-transmitting regions and a second pair of radiation-transmitting regions. The first pair of radiation-transmitting regions are along a first diametrical axis and the second pair of radiation-transmitting regions are along a second diametrical axis. The first pair of radiation-transmitting regions are larger than the second pair of radiation-transmitting regions. A second aperture is complementary to the first aperture and operable to be incorporated in the lithography system. The second aperture has a third pair of radiation-transmitting regions and a fourth pair of radiation-transmitting regions. The third pair of radiation-transmitting regions are along a third diametrical axis and the fourth pair of radiation-transmitting regions are along a fourth diametrical axis. The third pair of radiation-transmitting regions are larger than the fourth pair of radiation-transmitting regions. In an embodiment, the first and second diametrical axis are substantially perpendicular. In an embodiment, the third and fourth diametrical axis are substantially perpendicular.

In another embodiment, a method of photolithography is provided. In the method, a lithography system is provided. A first aperture is coupled to the lithography system. The first aperture includes a first pair and a second pair of radiation-transmitting regions. The first pair is larger than the second pair. An x-dipole illumination process is performed to form a first pattern on a substrate using the first aperture. A second aperture to the lithography system is coupled to the lithography system. The second aperture includes a third pair and a fourth pair of radiation-transmitting regions. The third pair is larger than the fourth pair. A y-dipole illumination process is performed using the second aperture to form a second pattern on the substrate.

In another embodiment, a lithography system is provided. The system includes a radiation source for providing a radiation energy and an imaging system configured to direct the radiation energy onto a substrate to form an image thereon. The system further includes a first aperture operable to be incorporated with the imaging system. The first aperture has a first pair of radiation-transmitting regions positioned along a first diametrical axis and a second pair of radiation-transmitting regions positioned along a second diametrical axis substantially perpendicular to the first diametrical axis. The first pair of radiation-transmitting regions allow a greater energy of radiation to transmit the first aperture than the second pair of radiation-transmitting regions. The system further includes a second aperture operable to be incorporated with the imaging system. The second aperture has a third pair of radiation-transmitting regions positioned along the first diametrical axis and a fourth pair of radiation-transmitting regions positioned along the second diametrical axis. The fourth pair of radiation-transmitting regions allow a greater energy of radiation to transmit the second aperture than the third pair of radiation-transmitting regions. The first and second apertures are interchangeable in the imaging system.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
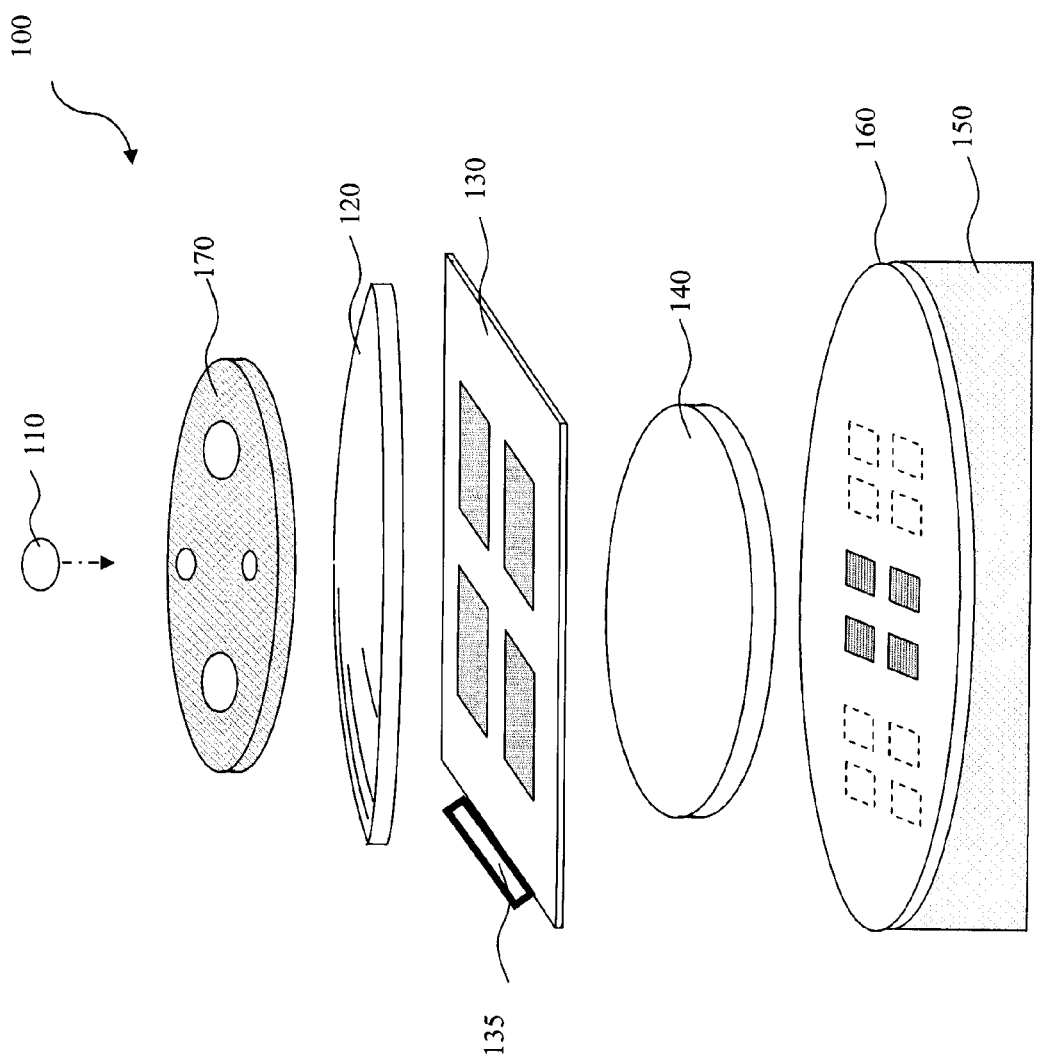
FIG. 1 is a schematic view of an exemplary embodiment of a lithography system.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, in one embodiment, a lithography system 100 includes a radiation source (or source) 110. The radiation source 110 may be any suitable radiation source. For example, the source 110 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other radiation sources having a desired wavelength (e.g., below approximately 100 nm). The radiation source may include an optical source selected from the group consisting of ultraviolet (UV) source, deep UV (DUV) source, extreme UV (EUV) source, and X-ray source. The radiation source may alternatively include a particle source selected from the group consisting of electron beam (E-Beam) source, ion beam source, and plasma source.

It is understood that in the above description of radiation sources, each radiation source may have a certain wavelength distribution, or line width, rather than an exact single wavelength. For example, the I-line (e.g., 365 nm) wavelength of the mercury lamp may not be exactly 365 nm, but may be centered at approximately 365 nm with a range of varying wavelengths extending above and below 365 nm. This range may be used to determine a minimum possible line width during photolithography, with less variation from the desired 365 nm wavelength resulting in a thinner line width.

The lithography system 100 includes an illumination system (e.g., a condenser) 120. The illumination system 120 may comprise a single lens or a lens system having multiple lenses and/or other lens components. For example, the illumination system 120 may include microlens arrays, shadow masks, and/or other structures designed to aid in directing light from the radiation source 110 onto a photomask.

During a lithography patterning process, a photomask (also referred to as a mask or a reticle) 130 may be included in the lithography system 100. The photomask 130 may include a transparent substrate and a patterned absorption layer. The transparent substrate may use fused silica ($SiO_2$) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN. A radiation beam may be partially or completely blocked when directed on an absorption region. The absorption layer may be patterned to have one or more openings through which a radiation beam may travel without being absorbed by the absorption layer. The mask may incorporate other resolution enhancement techniques such as phase shift mask (PSM) and/or optical proximity correction (OPC).

The lithography system 100 includes an objective lens 140. The objective lens 140 may have a single lens element or a plurality of lens elements. Each lens element may include a transparent substrate and may further include a plurality of coating layers. The transparent substrate may be a conventional objective lens, and may be made of fused silica ($SiO_2$), calcium-fluoride ($CaF_2$), lithium fluoride (LiF), barium fluoride ($BaF_2$), or other suitable material. The materials used for each lens element may be chosen based on the wavelength of light used in the lithography process to minimize absorption and scattering. The illumination system 120 (e.g., lens) and the objective lens 140 are collectively referred to as an imaging lens. The imaging lens may further include additional components such as an entrance pupil and an exit pupil to form an image defined in the photomask 130 on a substrate to be patterned.

The lithography system 100 may further include a substrate stage 150 capable of securing and moving a substrate in translational and rotational modes such that a target substrate may be aligned with the photomask 130.

In the present example, a substrate 160 may be provided in the lithography system 100 for receiving a lithography process. The substrate 160 may be a semiconductor wafer comprising an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or any combination thereof. The substrate 160 may have a photosensitive coating layer (e.g., photoresist) formed thereon during the lithography process. An exemplary photoresist includes chemical amplification resist (CAR).

The lithography system 100 includes an aperture 170 having a plurality of radiation-transmitting regions (also referred to as illumination poles or poles) to transmit radiation energy from the radiation source 110. The aperture 170 may be positioned between the radiation source 110 and the condenser 120 in the lithography system 100 and/or other possible locations. The radiation-transmitting regions are defined by and surrounded by, an opaque blocking material. Each radiation-transmitting region may be designed to be in various shapes, sizes, and/or angles. Each radiation-transmitting region may be disposed away from the optical axis for off-axis illumination. The plurality of radiation-transmitting regions are defined along radial axis perpendicular to the optical axis. Examples of apertures are described in FIGS. 2a, 2b, 3a, 3b, 4a, and 4c. The lithography system 100 may be configurable such that the aperture 170 may be removed (manually or automatically) and a differently configured aperture placed in the system 100.

The lithography system 100 may also incorporate other techniques and components. For example, a photomask stage 135 configured for securing and aligning the photomask 130. For example, the lithography system may also include components and mechanism to implement an immersion lithography process.

Figure 2B:
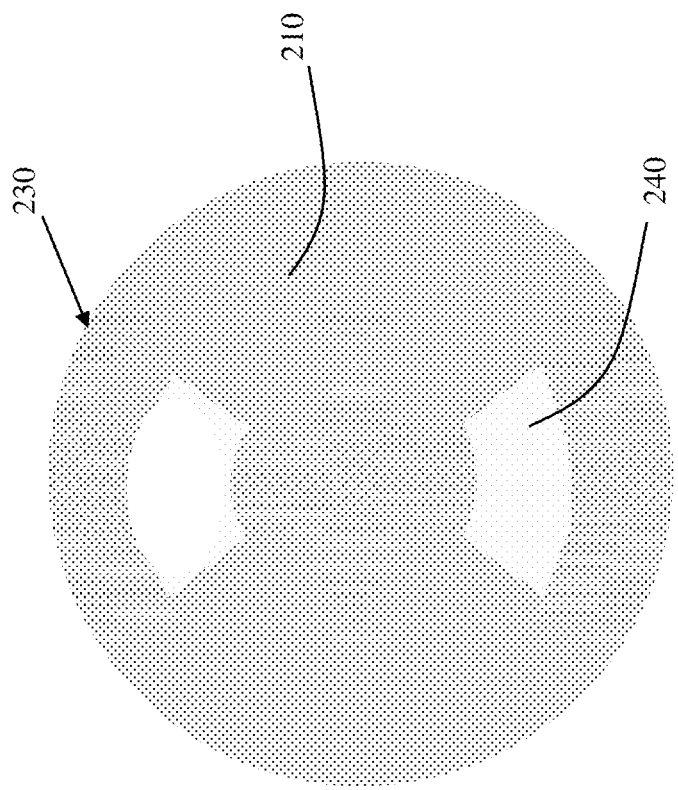
FIGS. 2a to 2b are top views of apertures used for DDL illumination.
Figure 2A:
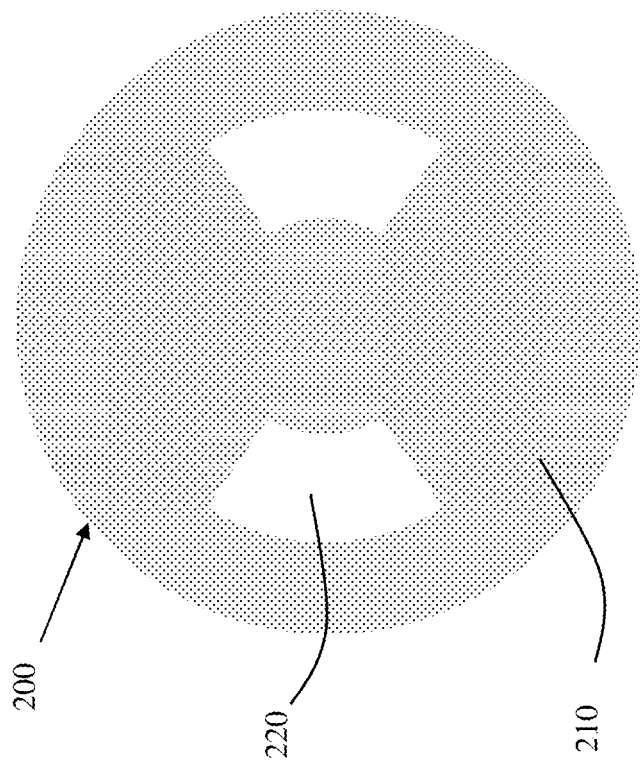

FIG. 2a illustrates an exemplary embodiment of an aperture 200. The exemplary aperture may be incorporated in the lithography system 100. The aperture 200 may be an aperture of a set of complementary apertures used in double patterning or DDL illumination. The aperture 200 includes a plate 210 being opaque to the radiation so that the radiation illuminated on the plate 210 will be blocked from transmitting through. The plate 210 may be made of a metal, metal alloy, or other proper material. The plate 210 may include proper coating materials. The plate 210 may have a circular perimeter defining a center to be aligned with the optical axis during a lithography process. A plurality of diametrical axis can be defined crossing the center (e.g., crossing perpendicular to the optical axis) an in the plane of the plate 210.

The aperture 200 further includes a pair of radiation-transmitting regions defined in the plate 210. A pair of radiation-transmitting regions 220 are positioned in a first diametrical axis and on opposite sides of the optical axis. For example, the pair of radiation-transmitting regions 220 are mirror-images of one another on the optical axis. In an embodiment, the aperture 200 is used for an x-dipole illumination (e.g., illumination of an x-dipole oriented pattern). In an embodiment, x-dipole oriented patterns include vertical lines. The radiation-transmitting regions may include transparent or translucent materials, an opening, and/or other suitable material.

FIG. 2b illustrates an exemplary embodiment of an aperture 230. The exemplary aperture may be incorporated in the lithography system 100. The aperture 230 may be an aperture of a set of complementary apertures for use in double patterning or DDL illumination. In an embodiment, the aperture 230 and the aperture 200 are complementary apertures. For example, in an embodiment, the aperture 200 may be positioned in the lithography system 100 and used to expose a first pattern on the substrate 160 (e.g., x-dipole illumination). Thereafter, the aperture 230 may be positioned in the lithography system 100 and used to expose a second pattern on the substrate 160 (e.g., y-dipole illumination). The complementary apertures may be used to form an aggregate pattern on a layer of a substrate by providing two illuminations of two decomposed portions of the aggregate pattern.

The aperture 230 may be substantially similar to the aperture 200 including the plate 210. However, the configuration of radiation-transmitting regions may be different, as illustrated. In the aperture 230, a pair of radiation-transmitting regions 240 are on a second diametrical axis and positioned on opposite sides of the optical axis. For example, the pair of radiation-transmitting regions 240 are mirror-images of one another on the optical axis. In an embodiment, the aperture 200 is used for an y-dipole illumination (e.g., illumination of an y-dipole oriented pattern). In an embodiment, a y-dipole oriented pattern includes horizontal lines. The second diametrical axis is substantially perpendicular to the first diametrical axis, illustrated in FIG. 2a. Both diametrical axis are substantially perpendicular to the optical axis of the lithography system.

A system including apertures such as the complementary apertures 200 and 230 may include disadvantages. In an embodiment, the apertures 200 and 230 may be used in a double dipole lithography system or method. The DDL process provides for a photolithography process exposing a pattern having a first directional orientation (e.g., x-dipole). This is followed by a photolithography process exposing a pattern having a second directional orientation (e.g., y-dipole). Following both exposures, an etch process may be performed to provide the final pattern (e.g., x and y oriented patterns combined) on the substrate. However, the DLL process window of this process may be small. Therefore, the lithography performance many not be well controlled and the optimization of the process is fairly restricted. An example issue is image overlay. There may be a small margin for error in overlaying the first exposure and the second exposure patterns. Additionally, the process may not produce 2D patterns sufficiently. Furthermore, heavy use of optical proximity correction (OPC) for sufficient resolution enhancement may be required. One or more of these disadvantages may be improved by one or more embodiments described below.

Figure 3B:
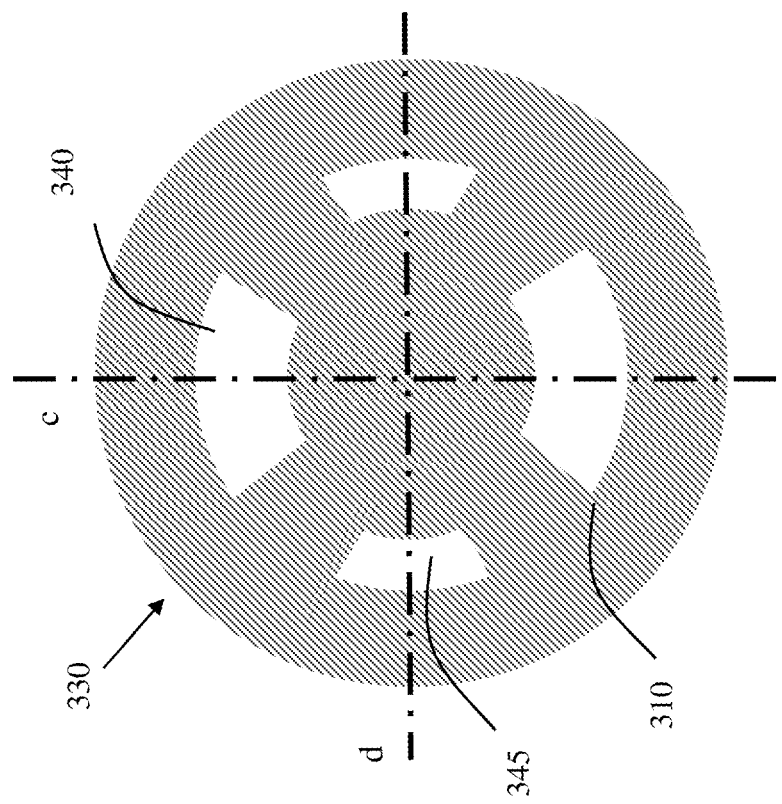
FIGS. 3a and 3b are top views of apertures used in an embodiment of CQDL illumination.
Figure 3A:
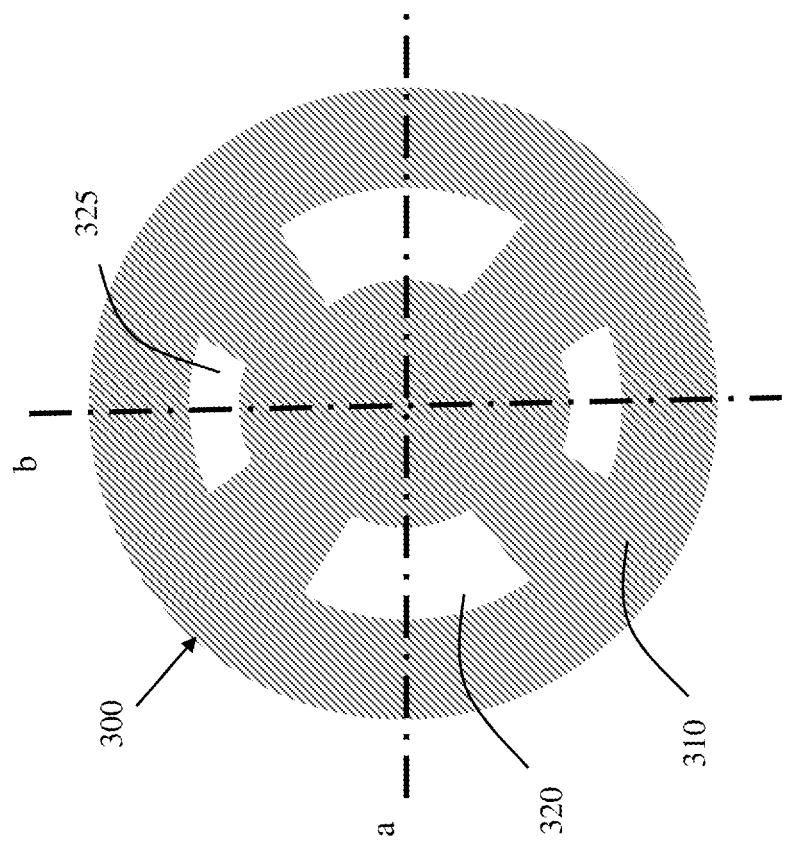

Referring now to FIGS. 3a and 3b illustrated are an embodiment of a complementary pair of apertures 300 and 330. The apertures 300 and 330 may be used in a cross quadrupole double lithography (CQDL) process such as described below with reference to FIG. 5. The apertures 300 and/or 330 may be used in the lithography system 100, for example, as the aperture 170.

The aperture 300 includes a plate 310 being opaque to the radiation so that the radiation illuminated on the plate 310 will be blocked from transmitting through. The plate 310 may be made of a metal, metal alloy, or other proper material. The plate 310 may include proper coating materials. The plate 310 may have a circular perimeter defining a center to be aligned with the optical axis during a lithography process. A plurality of diametrical axis can be defined crossing the center (e.g., crossing perpendicular to the optical axis) of the plate 310.

The aperture 300 further includes two pair of radiation-transmitting regions defined in the plate 310 (e.g., quadrupole). A first pair of radiation-transmitting regions 320 are positioned in a first diametrical axis and on opposite sides of the optical axis. The first pair of radiation-transmitting regions 320 may be mirror-images of one another about the optical axis. A second pair of radiation-transmitting regions 325 are positioned on a second diametrical axis. Each of the radiation-transmitting regions 325 may be mirror-images of one another about the optical axis. The first and second diametrical axis may be substantially perpendicular (as illustrated); however, numerous other configurations are possible. The first diametrical axis is labeled 'a' and the second diametrical axis is labeled 'b.'

The radiation-transmitting regions 320 allow a greater amount of radiation to pass the aperture 300 than the radiation-transmitting regions 325. In an embodiment, the radiation-transmitting regions 320 are larger in size than the radiation-transmitting regions 325. The radiation-transmitting regions 320 and 325 may include transparent or translucent materials, an opening, and/or other suitable material. In an embodiment, the aperture 300 is used for an x-dipole illumination (e.g., illumination of an x-dipole oriented pattern). In an embodiment, x-dipole illumination exposes a pattern including vertical features (e.g., lines).

Either or both pairs of radiation-transmitting regions, such as the first pair 320 or second pair 325, may be symmetrically designed for transmittance symmetrical relative to the optical axis. For example, each pair of radiation-transmitting regions may be designed to have a same geometrical shape, have a same size, be equally distanced from the center of the aperture, and have a same transmittance. Each radiation-transmitting region may be provided at any pole angle (e.g., diametrical axis). Each radiation-transmitting region may include a pole width (e.g., open angle) between approximately 0 degrees and 90 degrees.

In an embodiment, the radiation-transmitting regions 325 are at a pole angle of approximately 90 degrees. In an embodiment, the radiation-transmitting regions 325 have a width (e.g., open angle) of approximately 25 degrees. In an embodiment, the radiation-transmitting regions 320 are at a pole angle of approximately 0 degrees. In an embodiment, the radiation-transmitting regions 320 have a width (e.g., open angle) of approximately 45 degrees.

FIG. 3b illustrates an exemplary embodiment of an aperture 330. The exemplary aperture may be incorporated in the lithography system 100. The aperture 330 may be an aperture of a set of complementary apertures for use in CQDL illumination processes. In an embodiment, the aperture 330 and the aperture 300 are complementary apertures. For example, in an embodiment, the aperture 300 may be positioned in the lithography system 100 and used to expose a first pattern on the substrate 160 (e.g., x-dipole illumination). Thereafter, the aperture 330 may be positioned in the lithography system 100 and used to expose a second pattern on the substrate 160 (e.g., y-dipole illumination). The first and second pattern may be formed on the same layer of a target substrate.

The aperture 330 includes a plate 310 which may be substantially similar to the plate 310 of the aperture 300 described above. The aperture 330 further includes two pair of radiation-transmitting regions defined in the plate 310 (e.g., quadrupole). A first pair of radiation-transmitting regions 340 are positioned in a first diametrical axis and on opposite sides of the optical axis. The first pair of radiation-transmitting regions 340 may be mirror-images of one another about the optical axis. A second pair of radiation-transmitting regions 345 are positioned on a second diametrical axis. Each of the radiation-transmitting regions 345 may be mirror-images of one another about the optical axis. The first and second diametrical axis may be substantially perpendicular (as illustrated); however, numerous other configurations are possible. The first and second diametrical axis of FIG. 3b are labeled "c" and "d." The radiation-transmitting regions 340 allow a greater amount of radiation to pass the aperture 330 than the radiation-transmitting regions 345. In an embodiment, the radiation-transmitting regions 340 are larger in size than the radiation-transmitting regions 345. The radiation-transmitting regions 340 and 345 may include transparent or translucent materials, an opening, and/or other suitable material. In an embodiment, the aperture 330 is used for an y-dipole illumination (e.g., illumination of an y-dipole oriented pattern). In an embodiment, y-dipole illumination includes exposing a pattern including horizontally oriented features (e.g., lines).

Either or both pairs of radiation-transmitting regions, such as the first pair 340 or second pair 345, may be symmetrically designed for transmittance symmetrical relative to the optical axis. For example, each pair of radiation-transmitting regions may be designed to have a same geometrical shape, have a same size, be equally distanced from the center of the aperture, and have a same transmittance. Each radiation-transmitting region may be provided at any pole angle (e.g., diametrical axis). Each radiation-transmitting may include a pole width (e.g., open angle) between approximately 0 degrees and 90 degrees. In an embodiment, a greater amount of radiation is allowed to be transmitted by increasing the number of radiation-transmitting regions in lieu of or in addition to increasing the size of the radiation-transmitting regions.

In an embodiment, the radiation-transmitting regions 340 are at a pole angle of approximately 90 degrees. In an embodiment, the radiation-transmitting regions 340 have a width (e.g., open angle) of approximately 45 degrees. In an embodiment, the radiation-transmitting regions 345 are at a pole angle of approximately 0 degrees. In an embodiment, the radiation-transmitting regions 345 have a width (e.g., open angle) of approximately 25 degrees.

During a lithography exposing process (e.g., CQDL process), a first pair of radiation beams illuminates through the first pair of radiation-transmitting regions 320 and a second pair of radiation beams illuminates through the second pair of radiation-transmitting regions 325. The aperture is designed and configured such that the first pair of radiation beams and the second pair of radiation beams are not equal in terms of intensity. During a second exposure of the lithography process (e.g., CQDL process), a first pair of radiation beams illuminates through the first pair of radiation-transmitting regions 345 and a second pair of radiation beams illuminates through the second pair of radiation-transmitting regions 340. It is noted that in the complementary apertures, the radiation transmitting region 320 and 345 are substantially aligned (e.g., fall on the same diametrical axis (a=d) relative to an optical axis or pole angle) and the radiation regions 325 and 340 are substantially aligned (e.g., fall on the same diametrical axis relative to an optical axis (b=c)).

Figure 4B:
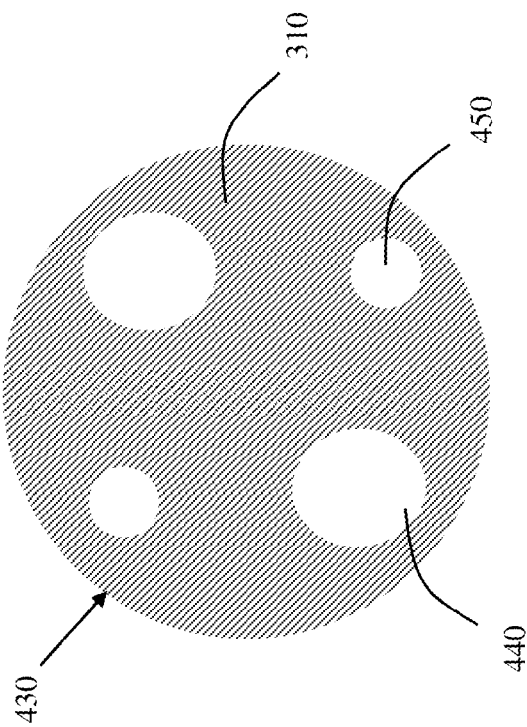
FIGS. 4a and 4b are top views of apertures used in an alternative embodiment of CQDL illumination.
Figure 4A:
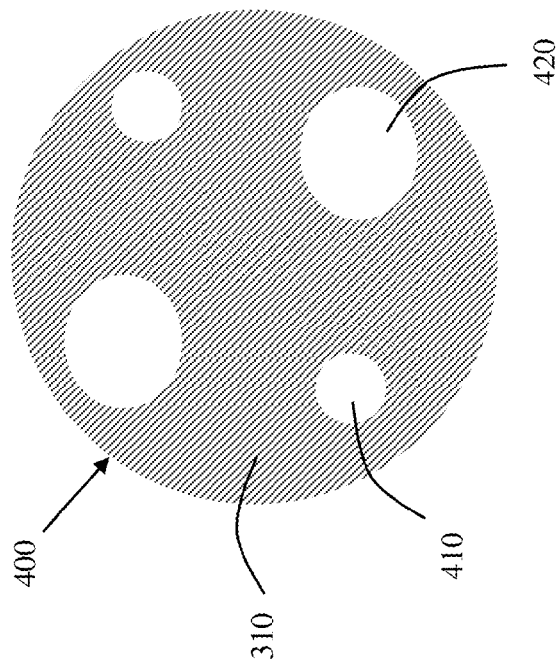

Referring now to FIGS. 4a and 4b, illustrated are additional exemplary embodiment of an aperture 400 and 430 that can be incorporated in the lithography system 100. The aperture 400 and 430 may be complementary apertures used in a CQDL process. For example, the aperture 400 may provide an x-dipole illumination and the aperture 430 may provide a y-dipole illumination such that when used together (e.g., two exposure processes) a complete pattern is formed. The apertures 400 and 430 may include a plate 310, substantially similar to the one illustrated in FIGS. 3a and 3b. The aperture 400 and 430 are provided to illustrate another embodiment of configuration and shape of the radiation-transmitting regions.

The aperture 400 includes a first pair of radiation-transmitting regions 410 and a second pair of radiation-transmitting regions 420. The radiation-transmitting regions 410 lie on a first diametrical axis and the second pair of radiation-transmitting regions 420 lie on a second diametrical axis. The radiation-transmitting regions 410 and 420 may be substantially similar to the radiation-transmitting regions 320 and 325, except that the vary in size, shape, and position (e.g., diametrical axis). The aperture 400 may be used to expose patterns of a first orientation.

The aperture 430 includes a first pair of radiation-transmitting regions 440 and a second pair of radiation-transmitting regions 450. The radiation-transmitting regions 440 lie on a first diametrical axis and the second pair of radiation-transmitting regions 450 lie on a second diametrical axis. The radiation-transmitting regions 440 and 450 may be substantially similar to the radiation-transmitting regions 340 and 345, except that the vary in size, shape, and position (e.g., diametrical axis). The aperture 430 may be used to expose patterns of a second orientation that differs from the orientation exposed by the aperture 400.

It is noted that the diametrical axis of radiation-transmitting regions 410 and 440 may be the same or substantially similar. The diametrical axis of radiation-transmitting regions 420 and 450 may be the same or substantially similar.

The configuration, size, open angles, and diametrical axis of the radiation-transmitting regions described above are exemplary only and not intended to be limiting in any manner. The configuration, sizes, angles, quantity, or similar features of the radiation-transmitting regions may be varied to provide optimization for the lithography process being performed. Specifically, the configuration, sizes, angles or the like may be varied such as to optimize the sigma provided by the lithography process. One of ordinary skill in the art would recognize varying the configuration, size, or angles of the poles of the exemplary apertures would effect the variability and optimization of sigma values for cross-quadrupole lithography. Variables such as the numerical aperture (NA), wavelength of radiation, properties (e.g., pitch, size) of pattern to be exposed, and the like, would be recognized as applicable to the selection of the configuration, size, shape, or angle of poles.

In an embodiment, a pair of complementary apertures may include a first aperture for x-dipole illumination and a second aperture for y-dipole illumination. In the embodiment, the aperture for x-dipole illumination may include four radiation-transmission regions (four poles or quadrupole) the regions providing the x-dipole being larger in size than the y-dipole. The aperture for the y-dipole illumination may include two radiation-transmission regions (two poles or dipole), providing radiation-transmission regions just in the y-dipole direction (e.g., FIG. 2b). Other embodiments may include other combinations of quadrupole and dipole apertures.

Figure 5:
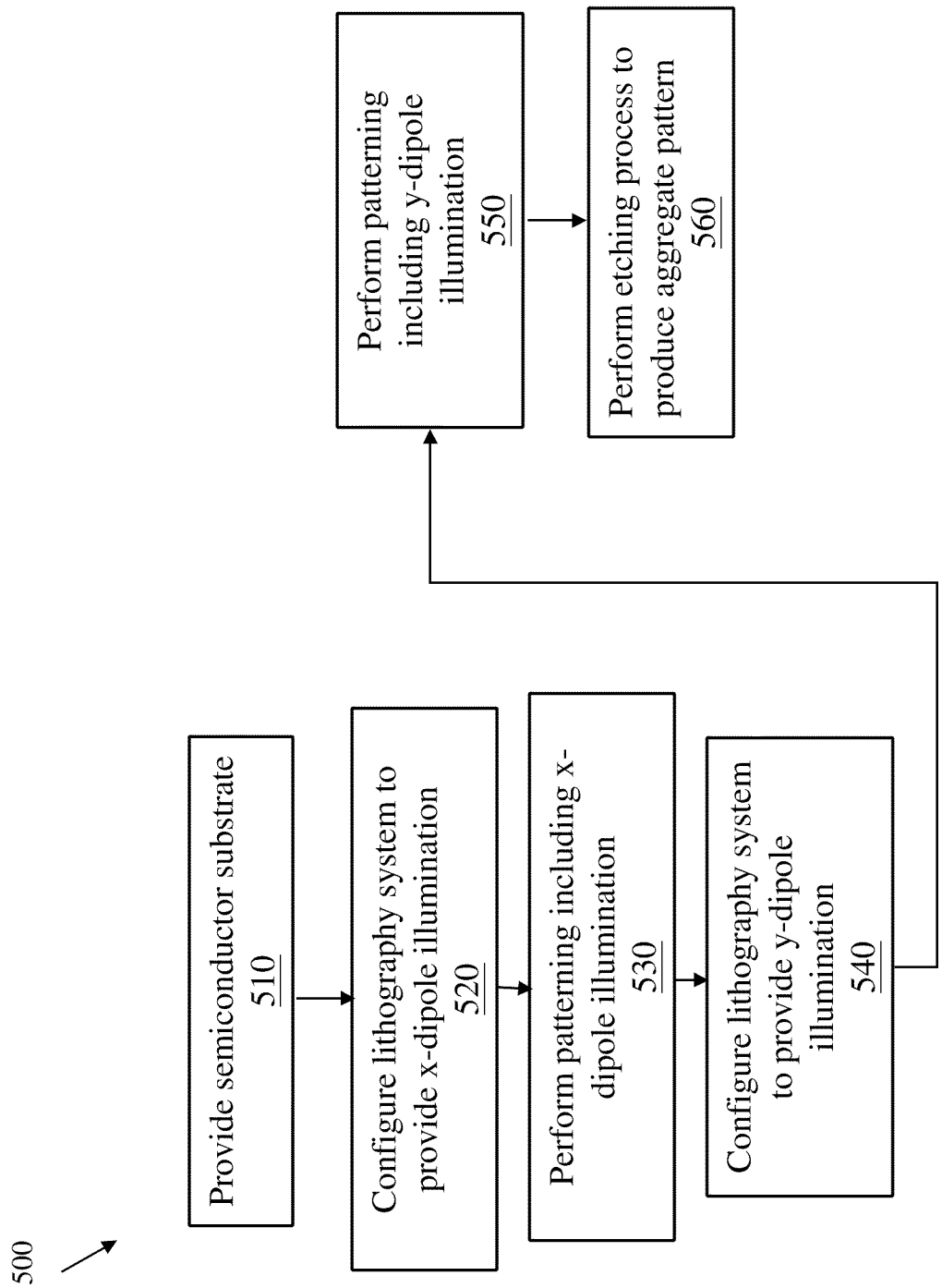
FIG. 5 is a flow chart illustrating an embodiment of a method of photolithography including CQDL illumination.

FIG. 5 illustrates a method 500 to implement cross quadrupole double lithography (CQDL) illumination. The method 500 may be used to implement CQDL in the lithography system 100. The system 100 may include apertures such as those depicted in FIGS. 3a, 3b, 4a, and 4b. In an embodiment, the method 500 may be used for a 22 nanometer technology node process; however, numerous other technologies may benefit.

The method begins at step 510 where a semiconductor substrate is provided. The semiconductor substrate may be coating with a photosensitive material (e.g., photoresist such as a chemical amplification resist (CAR)). The substrate may be substantially similar to the substrate 160, described above with reference to FIG. 1.

The method 500 then proceeds to step 520 where the lithography system is configured to provide x-dipole illumination. The lithography system may be substantially similar to the lithography system 100, described above with reference to FIG. 1. The lithography system may be configured to illuminate a part of a pattern that is finally formed on the substrate (e.g., the pattern is decomposed into a first part). Step 520 may be performed by configuring the lithography system to include an aperture providing a greater portion of radiation in an x-dipole direction. The aperture may be substantially similar to the aperture 400, described above with reference to FIG. 4a.

The method 500 then proceeds to step 530 where the illumination, using the lithography system configured in step 520, is performed. The illumination may be described as a x-dipole illumination. The x-dipole illumination may include illuminating (patterning or exposing) a set of features of a pattern onto the substrate. In an embodiment, the features patterned are vertical lines.

The method 500 then proceeds to step 540 where the lithography system is configured to provide y-dipole illumination. The lithography system may be substantially similar to the lithography system 100, described above with reference to FIG. 1. The lithography system may be configured to illuminate a part of a pattern that is finally formed on the substrate (e.g., the pattern is decomposed into a second part). Step 540 may be performed by configuring the lithography system to include an aperture providing a greater portion of radiation in a y-dipole direction. The aperture may be substantially similar to the aperture 430, described above with reference to FIG. 4b.

The method 500 then proceeds to step 550 where the illumination, using the lithography system configured in step 540, is performed. The illumination may be described as a y-dipole illumination. The y-dipole illumination may include illuminating (patterning or exposing) a set of features of a pattern onto the substrate. In an embodiment, the features patterned are horizontal lines. The illumination may include a strong off-axis illumination. The illumination may provide a pattern on the same photosensitive layer as the pattern of step 530. The step 550 may include further processes such as, baking, developing, rinsing, drying, and/or other suitable processes.

The method 500 then proceeds to step 560 where an etch process is performed. The etch process may use the pattern provided by the illumination of step 530 and step 550 as a masking element to etch one or more layers of the substrate. The etched pattern is referred to as an aggregate pattern being the pattern resulting from the aggregation of first pattern features (e.g., vertical lines) and second pattern features (e.g., horizontal lines). The etching may include wet etching, plasma etching, reactive ion etching (RIE), and/or other suitable processes.

Advantages of certain embodiments of CQDL including embodiments of the method 500 and/or embodiments using of the apertures of FIGS. 3a, 3b, 4a, or 4b, include increasing process margins that allows for increased illumination optimization. Embodiments may allow the process window to be enlarged. The OPC loading on the second pattern to be imaged may be decreased. Furthermore, the overlay window (e.g., process margin) of the first image to be patterned and the second image to be patterned may be increased. In another embodiment, 2D patterns may be more accurately formed. These exemplary advantages related to one or more embodiments described herein, but may not be present in each embodiments discussed herein.

The present disclosure has been described relative to one or more preferred embodiments. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method of using a lithography system, comprising:
providing a set of complementary aperture plates operable to image a layer of a substrate, wherein the set of complementary aperture plates includes:
a first aperture operable to be incorporated in the lithography system, the first aperture having a first plate having a first pair of radiation-transmitting regions and a second pair of radiation-transmitting regions, wherein the first pair of radiation-transmitting regions are along a first diametrical axis and the second pair of radiation-transmitting regions are along a second diametrical axis, and wherein the first pair of radiation-transmitting regions are larger than the second pair of radiation-transmitting regions, wherein the first diametrical axis is different than the second diametrical axis; and
a second aperture, complementary to the first aperture and operable to be incorporated in the lithography system, the second aperture having a second plate having a third pair of radiation-transmitting regions and a fourth pair of radiation-transmitting regions, wherein the third pair of radiation-transmitting regions are along a third diametrical axis and the fourth pair of radiation-transmitting regions are along a fourth diametrical axis, and wherein the third pair of radiation-transmitting regions are larger than the fourth pair of radiation-transmitting regions, wherein the third diametrical axis is different than the fourth diametrical axis;
using the first aperture to expose a first pattern on the layer of the substrate; and
thereafter using the second aperture to expose a second pattern on the layer of the substrate having the first pattern.

2. The method of using the lithography system of claim 1, further comprising providing:
a radiation source; and
an imaging system configured to direct the radiation onto the substrate to form a predefined image thereon, the imaging system defining an optical axis.

3. The method of using the lithography system of claim 2, wherein the optical axis is perpendicular to the first, second, third, and fourth diametrical axis.

4. The method of using the lithography system of claim 1, wherein the first diametrical axis is perpendicular to the second diametrical axis.

5. The method of using the lithography system of claim 1, wherein the first pair of radiation-transmitting regions and the second pair of radiation-transmitting regions are the same shape.

6. The method of using the lithography system of claim 1, further comprising providing a substrate stage configured for securing and aligning the substrate.

7. The method of using the lithography system of claim 1, further comprising providing a photomask stage configured for securing and aligning a photomask having a pattern formed thereon.

8. The method of using the lithography system of claim 1, wherein the first diametrical axis and the fourth diametrical axis are located at the same position relative to an optical axis of the lithography system.

9. The lithography system of claim 1, wherein the first aperture is optimized to perform a first dipole illumination, and wherein the second aperture is optimized to perform a second dipole illumination of the layer.

10. The lithography system of claim 9, wherein the first dipole illumination is an x-dipole illumination and the second dipole illumination is a y-dipole illumination.

11. A method of photolithography, comprising:
providing a lithography system;
coupling a first aperture to the lithography system, wherein the first aperture includes a first plate having a first pair and a second pair of radiation-transmitting regions, wherein the first pair is larger than the second pair;
performing an x-dipole illumination process to form a first pattern on a layer of a substrate using the first aperture;
coupling a second aperture to the lithography system, wherein the second aperture includes a second plate having a third pair and a fourth pair of radiation-transmitting regions, wherein the third pair is larger than the fourth pair; and
performing a y-dipole illumination process to form a second pattern on the layer of the substrate using the second aperture.

12. The method of claim 11, further comprising:
performing an etch process on the substrate, wherein the etch process provides a pattern defined by an aggregation of the first pattern and the second pattern.

13. The method of claim 11, wherein the layer having the first pattern and the second pattern is photosensitive material.

14. The method of claim 11, wherein the x-dipole illumination includes patterning vertically oriented features.

15. The method of claim 11, wherein the y-dipole illumination includes patterning horizontally oriented features.

16. A method of operating a lithography system, comprising:
providing a radiation energy from a radiation source;
using an imaging system to direct the radiation energy through a photomask and onto a substrate to form an image thereon; and
providing a first aperture, having a first pair of radiation-transmitting regions positioned along a first diametrical axis, and having a second pair of radiation-transmitting regions positioned along a second diametrical axis substantially perpendicular to the first diametrical axis, wherein the first pair of radiation-transmitting regions allow a greater radiation energy to transmit through the first aperture than the second pair of radiation-transmitting regions;
using the first aperture to expose a first pattern onto a layer of the substrate, wherein the first pattern has horizontally oriented features, wherein the first pattern is defined by the photomask;
replacing the first aperture with a second aperture, having a third pair of radiation-transmitting regions positioned along the first diametrical axis, and having a fourth pair of radiation-transmitting regions positioned along the second diametrical axis, wherein the fourth pair of radiation-transmitting regions allow a greater radiation energy to transmit through the second aperture than the third pair of radiation-transmitting regions, wherein the first and second aperture are interchangeable in the imaging system; and
using the second aperture to expose a second pattern onto the layer of the substrate, wherein the second pattern is defined by the photomask and wherein the second pattern has vertically oriented features.

17. The method of operating the lithography system of claim 16, further comprising configuring and aligning a photomask.

18. The method of operating the lithography system of claim 16, wherein the photomask includes the second pattern having vertically oriented features and the first pattern having horizontally-oriented features.

19. The method of operating the lithography system of claim 16, wherein the first pair of radiation-transmitting regions have an open angle of approximately 45 degrees and the second pair of radiation-transmitting regions have an open angle of approximately 25 degrees.

* * * * *